US010359450B1

(12) United States Patent
Oliva et al.

(10) Patent No.: US 10,359,450 B1
(45) Date of Patent: Jul. 23, 2019

(54) CURRENT SENSING PROBE INCORPORATING A CURRENT-TO-VOLTAGE CONVERSION CIRCUIT

(71) Applicant: Keysight Technologies, Inc., Santa Rosa, CA (US)

(72) Inventors: Alexander Oliva, Boston, MA (US); Edward Vernon Brush, IV, Colorado Springs, CO (US)

(73) Assignee: Keysight Technologies, Inc., Santa Rosa, CA (US)

( * ) Notice: Subject to any disclaimer, the term of this patent is extended or adjusted under 35 U.S.C. 154(b) by 0 days.

(21) Appl. No.: 15/402,324

(22) Filed: Jan. 10, 2017

(51) Int. Cl.
*G01R 15/18* (2006.01)
*G01R 19/00* (2006.01)
*G01R 1/30* (2006.01)
*G01R 19/25* (2006.01)

(52) U.S. Cl.
CPC ............. *G01R 15/186* (2013.01); *G01R 1/30* (2013.01); *G01R 19/0092* (2013.01); *G01R 19/2506* (2013.01)

(58) Field of Classification Search
CPC .... G01R 15/18; G01R 15/181; G01R 15/185; G01R 15/186; G01R 19/25; G01R 19/2506; G01R 19/00; G01R 19/0092; G01R 33/028; G01R 1/30
See application file for complete search history.

(56) References Cited

U.S. PATENT DOCUMENTS

| | | | | |
|---|---|---|---|---|
| 3,811,089 A | * | 5/1974 | Strzelewicz | G01P 3/4807 324/170 |
| 3,815,013 A | | 6/1974 | Milkovic | |
| RE28,851 E | | 6/1976 | Milkovic | |
| 4,198,595 A | * | 4/1980 | Milkovic | G01R 15/183 323/357 |
| 4,517,511 A | * | 5/1985 | Suto | G01R 31/3004 324/527 |
| 6,118,828 A | * | 9/2000 | Schleifer | H04B 1/30 341/176 |
| 6,340,916 B1 | | 1/2002 | Chen | |
| 6,566,854 B1 | | 5/2003 | Hagmann | |
| 7,309,980 B2 | | 12/2007 | Mende | |
| 7,822,390 B2 | * | 10/2010 | Essabar | H04B 5/0075 343/841 |
| 2004/0239570 A1 | * | 12/2004 | Aisenbrey | G01R 1/067 343/702 |
| 2008/0191705 A1 | * | 8/2008 | Bellan | G01R 31/024 324/529 |
| 2015/0233961 A1 | * | 8/2015 | Bony | G01P 5/26 356/28 |
| 2016/0153961 A1 | | 6/2016 | Kuramochi | |

FOREIGN PATENT DOCUMENTS

WO  WO2015/145110 A1  10/2015

* cited by examiner

*Primary Examiner* — Son T Le

(57) ABSTRACT

Generally, in accordance with the various illustrative embodiments disclosed herein, a current sensing probe includes a current-to-voltage conversion circuit that not only presents a desirable impedance into an inductive current sensing element of the current sensing probe, but also remains operationally stable over a wide range of frequencies when measuring a current flowing through a device-under-test. The wide frequency range can extend down to some low frequencies that can prove challenging to conventional current sensing probe circuits.

17 Claims, 5 Drawing Sheets

CURRENT SENSING PROBE INCORPORATING A CURRENT-TO-VOLTAGE CONVERSION CIRCUIT

BACKGROUND

AC current sensing probes are typically used to measure AC current flowing through a conductor on a device-under-test (DUT). Such current sensing probes can be broadly classified into two categories—passive current sensing probes that do not require a power source for operation and active current sensing probes that include circuitry requiring a power source to operate. Passive current sensing probes generally suffer from bandwidth issues and can only be used to measure AC currents having a limited range of frequencies. Consequently, some passive current sensing probes have been equipped with frequency compensating elements such as inductors and capacitors that boost signal amplitudes at either a low end of a frequency band of operation or at a high end of the frequency band of operation. However, this approach generally provides a very limited amount of improvement in frequency response. Additionally, some passive current sensing probes can disturb and/or modify the AC current flow in a current-carrying conductor when connected to the current-carrying conductor for purposes of current measurement, thereby leading to inaccurate results. This issue is particularly problematic when the AC current frequency is high and thus more susceptible to disturbance.

Active current sensing probes address some of the limitations inherent in passive current sensing probes. However, many conventional active current sensing probes still suffer from frequency bandwidth limitations, often as a result of impedance mismatch issues between the probes and the DUT. The impedance mismatch issue can lead to an insertion loss that is manifested as an undesirable amount of current being drawn by the current sensing probe from a current-carrying conductor in the DUT, thereby modifying the current flow in the DUT and providing an erroneous current measurement. Consequently, in some conventional cases, a sensitivity parameter of an active current sensing probe is undesirably sacrificed in order to minimize insertion loss.

SUMMARY

Certain embodiments of the disclosure can provide a technical effect and/or solution pertaining to a current sensing probe having a current-to-voltage conversion circuit that not only presents a desirable impedance into an inductive current sensing element of the current sensing probe, but also remains operationally stable over a wide range of frequencies when measuring an AC current flowing through a DUT. The wide frequency range can extend down to some low frequencies that can prove challenging to conventional current sensing probe circuits.

According to one exemplary embodiment of the disclosure, a current sensing probe includes an inductive current sensing element and a current-to-voltage conversion circuit connected to the inductive current sensing element. The current-to-voltage conversion circuit can include an operational amplifier, a coupling capacitor, a first resistor, and a second resistor. The coupling capacitor is disposed between the inductive current sensing element and a negative input terminal of the operational amplifier. The first resistor is coupled between the negative input terminal of the operational amplifier and an output node of the operational amplifier, the first resistor selected to provide stability to the operational amplifier when the coupling capacitor blocks a first signal frequency that is below a threshold frequency. The second resistor is coupled between the inductive current sensing element and the output node of the operational amplifier, the second resistor operating in parallel with the first resistor to provide a transimpedance gain to a second signal frequency that is above the threshold frequency.

According to another exemplary embodiment of the disclosure, a current sensing probe includes an inductive current sensing element and a current-to-voltage conversion circuit connected to the inductive current sensing element. The current-to-voltage conversion circuit can include an operational amplifier, a coupling capacitor, and a first resistor. The coupling capacitor is disposed between the inductive current sensing element and a negative input terminal of the operational amplifier. The first resistor is coupled between the negative input terminal of the operational amplifier and an output node of the operational amplifier, the first resistor selected to provide stability to the operational amplifier when no current is coupled into the inductive current sensing element.

According to yet another exemplary embodiment of the disclosure, a current sensing probe includes an inductive current sensing element and a current-to-voltage conversion circuit connected to the inductive current sensing element. The current-to-voltage conversion circuit can include an operational amplifier and a current buffer circuit. The current buffer circuit, which is disposed between the inductive current sensing element and an input terminal of the operational amplifier, is configured to couple into the operational amplifier, an AC current sensed by the inductive current sensing element.

Other embodiments and aspects of the disclosure will become apparent from the following description taken in conjunction with the following drawings.

BRIEF DESCRIPTION OF THE FIGURES

Many aspects of the invention can be better understood by referring to the following description in conjunction with the accompanying claims and figures. Like numerals indicate like structural elements and features in the various figures. For clarity, not every element may be labeled with numerals in every figure. The drawings are not necessarily drawn to scale; emphasis instead being placed upon illustrating the principles of the invention. The drawings should not be interpreted as limiting the scope of the invention to the example embodiments shown herein.

DETAILED DESCRIPTION

Throughout this description, embodiments and variations are described for the purpose of illustrating uses and implementations of inventive concepts. The illustrative description should be understood as presenting examples of inventive concepts, rather than as limiting the scope of the concepts as disclosed herein. Towards this end, certain words and terms are used herein solely for convenience and such words and terms should be broadly understood as encompassing various objects and actions that are generally understood in various forms and equivalencies by persons of ordinary skill in the art. For example, the words "terminal," "node," and "lead" as used herein in an interchangeable manner generally pertain to a part of a device that can be used to connect the device to another device or circuit element. In the case of a device such as a resistor, a capacitor, an inductor, or an operational amplifier, any of the words "terminal," "node," and "lead" can indicate for example a wire lead that can be inserted into a hole in a printed circuit board (PCB), a tab that can be soldered onto a pad on a surface of the PCB, or a pad of a surface mount technology (SMT) device that can be soldered onto a pad on a surface of the PCB. It should also be understood that the word "example" as used herein is intended to be non-exclusionary and non-limiting in nature. More particularly, the word "exemplary" as used herein indicates one among several examples and it should be understood that no special emphasis, exclusivity, or preference, is associated or implied by the use of this word.

Generally, in accordance with the various illustrative embodiments disclosed herein, a current sensing probe includes a current-to-voltage conversion circuit that not only presents a desirable matching impedance into an inductive current sensing element of the current sensing probe thereby minimizing insertion loss when used to measure a current flowing in a device-under-test (DUT), but also remains operationally stable over a wide range of frequencies when measuring a current flowing through the DUT. The wide frequency range obtained in accordance with the disclosure encompasses certain low frequency current measurements that can pose challenges to various conventional current sensing probe circuits.

Figure 1:
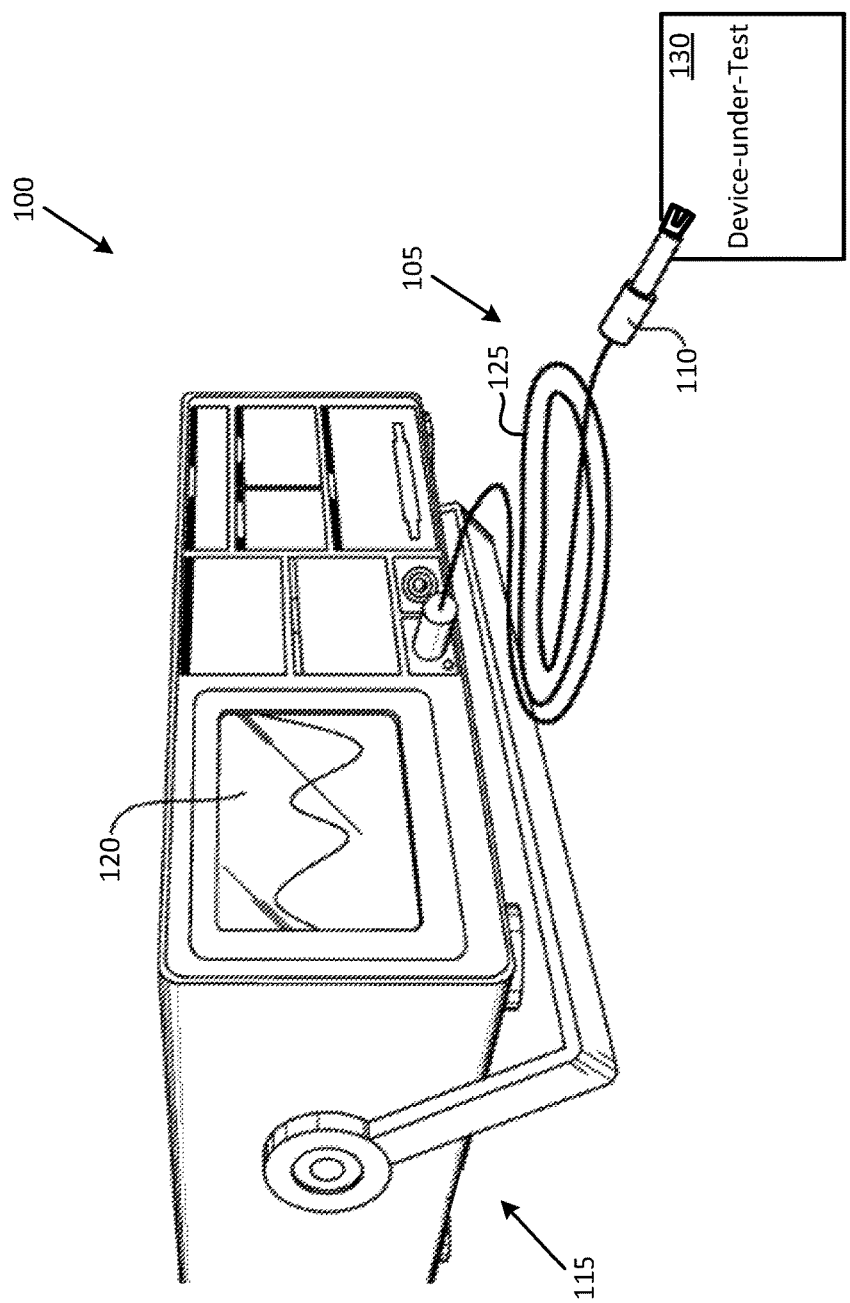
FIG. 1 shows an exemplary measurement system that includes a current sensing probe in accordance with the disclosure.

Attention is now drawn to FIG. 1, which shows an exemplary measurement system 100 that includes a current sensing probe 105 attached to a measurement instrument 115 in accordance with the disclosure. The current sensing probe 105, which can be a clip-on current probe or a solid core current probe for example, includes a probe module 110. The probe module 110 is used to couple the current sensing probe 105 to a current carrying conductor in a DUT 130 when carrying out an AC current measurement. The AC current coupled into the probe module 110 is converted into a voltage in the probe module 110. The voltage is provided to the measurement instrument 115 via a cable assembly 125 that is used for connecting the current sensing probe 105 to the measurement instrument 115. The measurement instrument 115, which can be any of various devices such as an oscilloscope, a voltmeter, or a signal analyzer, can include a display 120 on which various characteristics of the voltage provided by the probe module 110 can be observed. Such characteristics can include amplitude characteristics, frequency characteristics, phase characteristics, noise characteristics, ripple characteristics, and transient signal characteristics.

Figure 2:
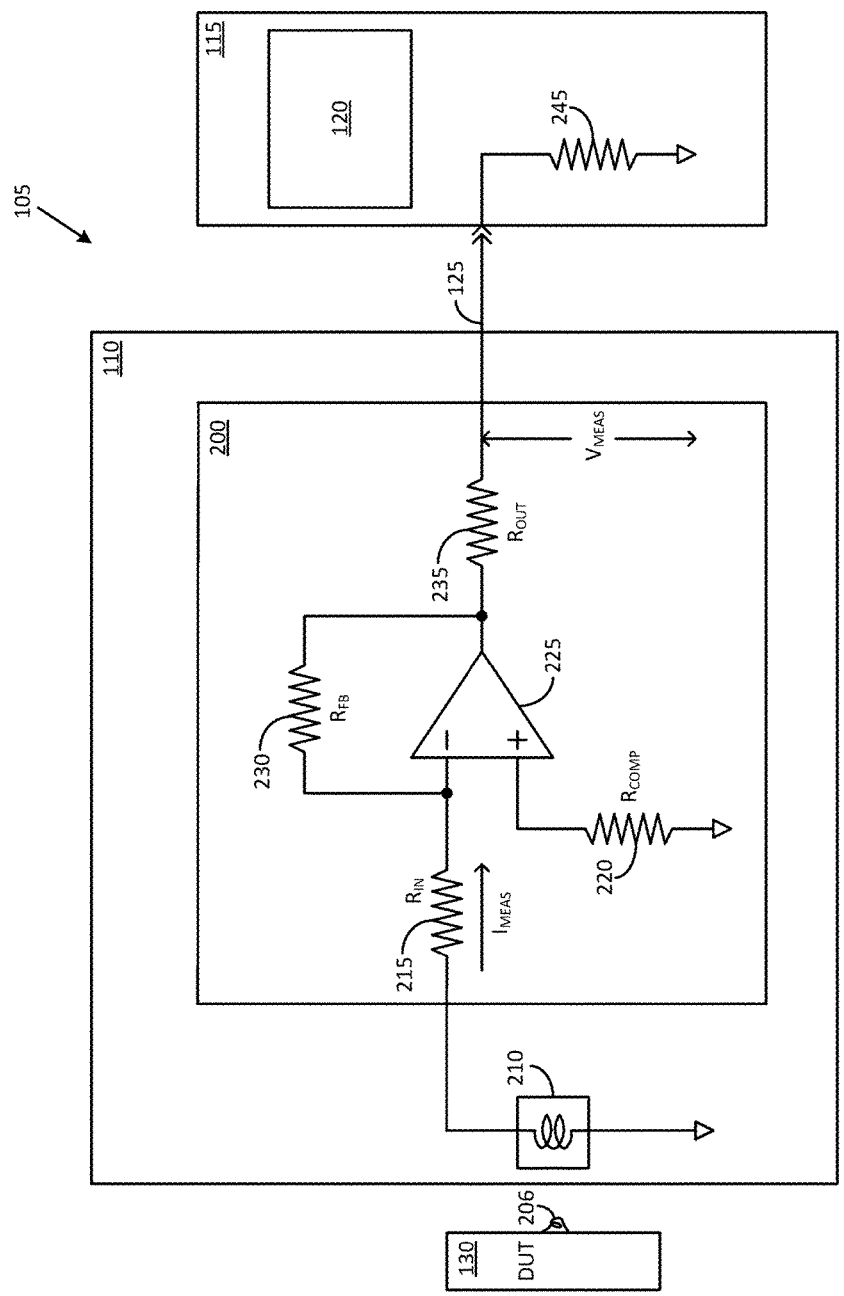
FIG. 2 illustrates a first exemplary circuit that can be incorporated into the current sensing probe shown in FIG. 1.

FIG. 2 illustrates an exemplary current-to-voltage conversion circuit 200 that can be incorporated into the probe module 110 of the current sensing probe 105 in accordance with the disclosure. An inductive current sensing element 210 that is also incorporated into the probe module 110 in this exemplary embodiment, can be placed in the proximity of a current carrying element 206 in the DUT 130 when carrying out an AC current measurement. The current carrying element 206 can be a wire that is a part of the DUT 130.

The inductive current sensing element 210 can be implemented in various ways, such as in the form of a coil of wire that is housed inside the probe module 110. The coil of wire in the inductive current sensing element 210 inductively senses a current propagating through the current carrying element 206 in the DUT 130. For purposes of understanding the sensing operation, the coil of wire in the inductive current sensing element 210 can be viewed as being equivalent to a secondary winding of a transformer and the current carrying element 206 in the DUT 130 can be viewed as being equivalent to a primary winding of the transformer.

The current-to-voltage conversion circuit 200 can be used to measure various parameters such as an amplitude or a frequency of an input AC current ($I_{MEAS}$) that is sensed by the inductive current sensing element 210 and provided to the current-to-voltage conversion circuit 200 for conversion into a measured voltage ($V_{MEAS}$). Towards this end, the input AC current ($I_{MEAS}$) is propagated via a series input resistor 215 ($R_{IN}$) into a negative input terminal of an operational amplifier 225. A feedback resistor 230 ($R_{FB}$) is coupled between the negative input terminal and an output terminal of the operational amplifier 225. A compensation resistor 220 ($R_{COMP}$) can be coupled into a positive input terminal of the operational amplifier 225 in order to compensate for any offset current and/or offset voltage that may be present in the operational amplifier 225.

The series input resistor 215 ($R_{IN}$) is provided so as to avoid coupling the negative input terminal of the operational amplifier 225 directly to a DC ground potential via the coil of wire in the inductive current sensing element 210. The resistance value of the series input resistor 215 is selected on the basis of a trade-off between selecting a high resistance value that provides a significant amount of isolation to the negative input terminal with respect to ground and an undesirable voltage drop that will occur in the series input resistor 215 when the input current ($I_{MEAS}$) flows through the series input resistor 215.

Care is taken when determining a low end of a range of resistance values for the series input resistor 215, because using a low resistance value can lead to instability in the current-to-voltage conversion circuit 200 in some cases. The instability can arise as a result of the amplification factor ($R_{FB}/R_{IN}$) of the current-to-voltage conversion circuit 200 becoming very high and/or indeterminate as the denominator ($R_{IN}$) of the amplification factor approaches zero.

In one example implementation in accordance with the disclosure, the series input resistor 215 ($R_{IN}$) is selected in the range of about 1-2 ohms and the feedback resistor 230 ($R_{FB}$) can be selected for obtaining a desired gain-bandwidth product in the current-to-voltage conversion circuit 200.

The series output resistance 235 ($R_{OUT}$) can be selected to provide a matching impedance to an input resistance 245 of the measurement instrument 115. Thus, when the input resistance 245 of the measurement instrument 115 is 50 ohms, the series output resistance 235 ($R_{OUT}$) can be also equal to 50 ohms.

Figure 3:
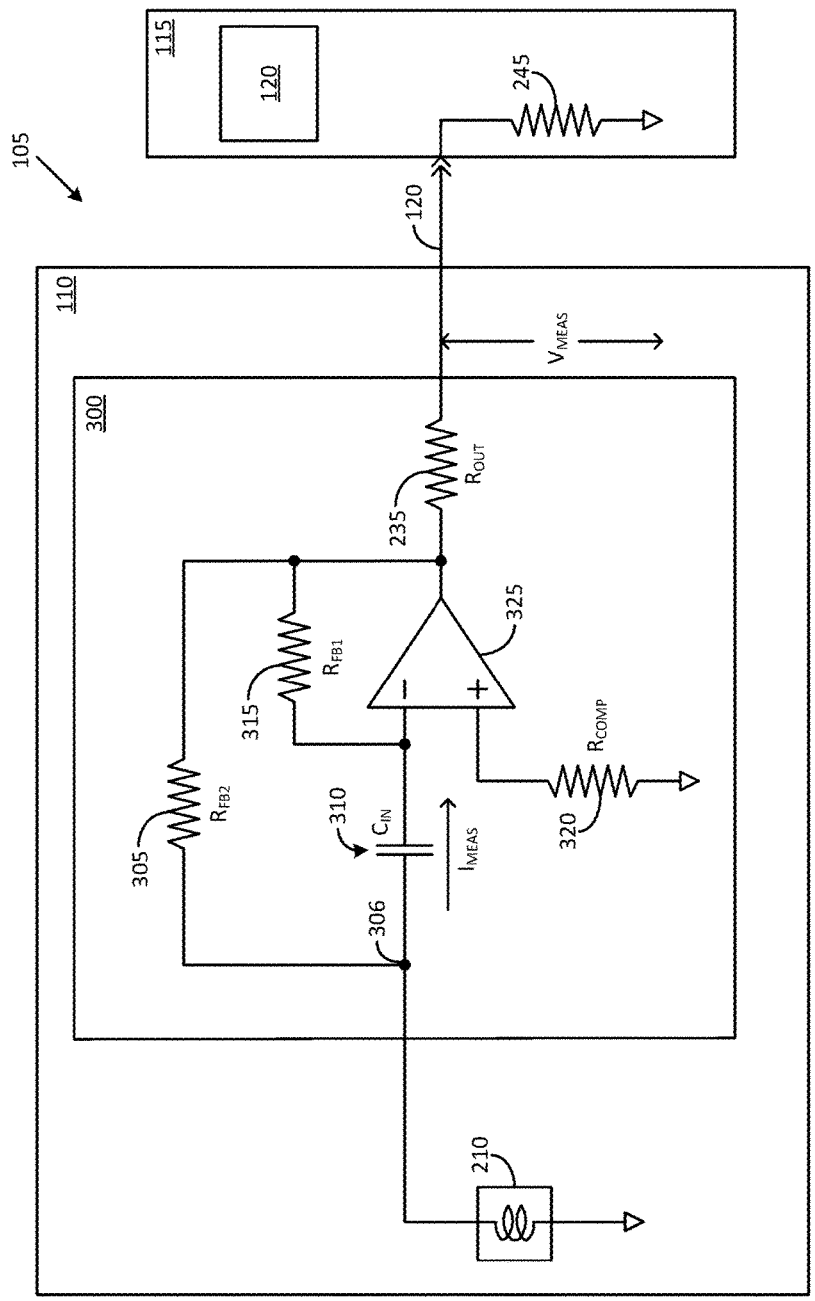
FIG. 3 illustrates a second exemplary circuit that can be incorporated into the current sensing probe shown in FIG. 1.

FIG. 3 illustrates a second exemplary current-to-voltage conversion circuit 300 that can be incorporated into the probe module 110 of the current sensing probe 105 in accordance with the disclosure. The current-to-voltage conversion circuit 300 can be used to measure various parameters such as an amplitude and a frequency of an input AC current ($I_{MEAS}$) that is sensed by the inductive current sensing element 210 and provided to the current-to-voltage conversion circuit 300 for conversion into a measured voltage ($V_{MEAS}$). Towards this end, the input AC current ($I_{MEAS}$) is propagated via a coupling capacitor 310 ($C_{IN}$) into a negative input terminal of an operational amplifier 325. In addition to providing a current propagation path into the negative input terminal of an operational amplifier 325, the coupling capacitor 310 ($C_{IN}$) also provides to the negative input terminal of the operational amplifier 325, a high AC impedance with reference to ground.

The value of the coupling capacitor 310 ($C_{IN}$) can be selected on the basis of a desired bandwidth of the current-to-voltage conversion circuit 300. A threshold frequency that typically corresponds to a low-end of the desired bandwidth, defines a minimum frequency of operation of the current sensing probe 105. The threshold frequency can be determined by an entity such as a manufacturer and/or a user of the current sensing probe 105. Some other criteria that can be used for determining the threshold frequency are described below. The coupling capacitor 310 ($C_{IN}$) blocks a first portion of the input AC current ($I_{MEAS}$) having a first signal frequency that is below the threshold frequency.

A first feedback resistor 315 ($R_{FB1}$) is coupled between the negative input terminal and an output terminal of the operational amplifier 325. The first feedback resistor 315 ($R_{FB1}$) is selected to maintain the negative input terminal of the operational amplifier 325 at a voltage potential that provides stability to the operational amplifier 325 when the coupling capacitor 310 blocks the first signal frequency that is below the threshold frequency. Under this condition, the negative input terminal of the operational amplifier 325 would be rendered an open circuit if the first feedback resistor 315 ($R_{FB1}$) was not present. The first feedback resistor 315 ($R_{FB1}$) is typically selected to have a high resistance value, such as in a MΩ range or high kΩ range. In one example implementation, the first feedback resistor 315 ($R_{FB1}$) is selected to have a resistance value of about 1 MΩ.

A compensation resistor 320 ($R_{COMP}$) can be coupled into a positive input terminal of the operational amplifier 325 in order to compensate for any offset current or offset voltage that may be present in the operational amplifier 325. The compensation resistor 320 couples the positive input terminal of the operational amplifier 325 to ground.

As indicated above, the coupling capacitor 310 (CIN) is selected in accordance with the minimum frequency of operation and can also be selected in accordance with an operational bandwidth of the inductive current sensing element 210. The minimum frequency of operation can be considered as a threshold frequency that defines a low-end limit of the operational bandwidth of the current sensing probe 105. Understandably, the low-end limit of the operational bandwidth cannot include DC, and the threshold frequency corresponding to the low-end limit has to be therefore determined on the basis of various other criteria. Such criteria can include a frequency response characteristic of the inductive current sensing element 210. For example, when the inductive current sensing element 210 includes a coil of wire having "n" (n≥1) number of windings, the "n" number of windings can have an impedance characteristic (reactive as well as resistive) that defines a frequency response of the inductive current sensing element 210. Frequencies that are below a low-end cut-off frequency of this frequency response cannot be sensed by the inductive current sensing element 210 and will therefore not be coupled into the current-to-voltage conversion circuit 300.

The coupling capacitor 310 ($C_{IN}$) can be defined in further part based on an R-C time-constant formed between the coupling capacitor 310 ($C_{IN}$) and the first feedback resistor 315 ($R_{FB1}$). This time-constant can be matched to a time-constant parameter of the inductive current sensing element 210 and other parameters that are a part of the current-to-voltage conversion circuit 300 such as a gain-bandwidth parameter of the operational amplifier 325 and a transimpedance gain that is provided in part by selecting a suitable resistance value for the second feedback resistor 305 ($R_{FB2}$).

A high-end limit of the operational bandwidth of the current sensing probe 105 can be also used to configure the coupling capacitor 310 ($C_{IN}$) to propagate into the negative input terminal of the operational amplifier 325, a second portion of the input AC current ($I_{MEAS}$) having a second signal frequency that is above the threshold frequency but below the high-end limit of the operational bandwidth of the current sensing probe 105. The impedance presented by the coupling capacitor 310 ($C_{IN}$) to this second signal frequency is very low.

The second feedback resistor 305 ($R_{FB2}$) is coupled between the output node of the operational amplifier 325 and a junction node 306 located between the inductive current sensing element 210 and the coupling capacitor 310 ($C_{IN}$). The second feedback resistor 305 ($R_{FB2}$) having a resistance value that can be selected, at least in part, for obtaining a desired gain-bandwidth product in the current-to-voltage conversion circuit 300, effectively operates in parallel with the first feedback resistor 315 ($R_{FB1}$) when the coupling capacitor 310 ($C_{IN}$) is presenting the very low impedance (ideally zero ohms) to the second portion of the input AC current ($I_{MEAS}$) at the second signal frequency.

In one exemplary implementation, the second feedback resistor 305 ($R_{FB2}$) is selected to have a low resistance value in comparison to the first feedback resistor 315 ($R_{FB1}$). As a result of this selection, the effective resistance when the second feedback resistor 305 ($R_{FB2}$) having the low resistance value operates in parallel with the first feedback resistor 315 ($R_{FB1}$) having the high resistance value, is approximately equal to the low resistance value of the second feedback resistor 305 ($R_{FB2}$). Thus, for example, when the first feedback resistor 315 ($R_{FB1}$) is a 1 MΩ resistor and the second feedback resistor 305 ($R_{FB2}$) is a 50Ω resistor, the effective resistance in the feedback portion of the current-to-voltage conversion circuit 300 is approximately equal to 50 ohms. The effective resistance can provide a desirably high AC amplification factor ($R_{FB}/R_{IN}$) in the current-to-voltage conversion circuit 200 for any AC current frequency that is within the operational bandwidth of the current sensing probe 105.

An appropriate selection of component characteristics and/or values for the various components of the current-to-voltage conversion circuit 300 can provide a current sensing probe 105 having a frequency response that is relatively flat and spans several decades (at least 2 decades.) The low-end frequency response of the current-to-voltage conversion circuit 300 can extend several decades below that provided by a passive current sensing probe. Furthermore, in accordance with the disclosure, the current-to-voltage conversion circuit 300 presents a low impedance to the inductive current sensing element 210, thereby minimizing an amount of loading imposed upon the DUT 130 when the current sensing probe 105 is coupled to the current carrying element 206 for carrying out an AC current measurement. Minimizing the amount of loading imposed upon the DUT 130 can be beneficial in various ways such as minimizing RF perturbances in the DUT 130.

Figure 4:
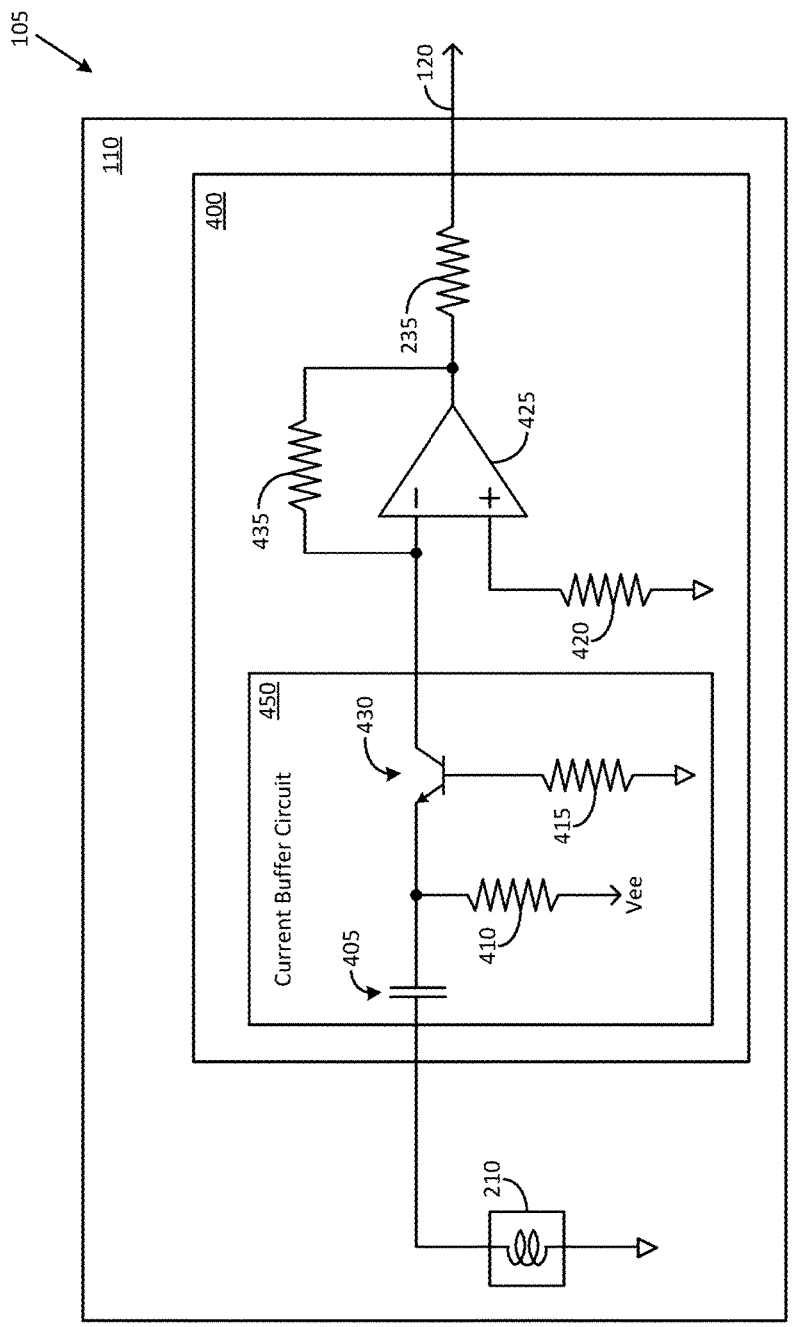
FIG. 4 illustrates a third exemplary circuit that can be incorporated into the current sensing probe shown in FIG. 1.

Attention is next drawn to FIG. 4, which illustrates a third exemplary current-to-voltage conversion circuit 400 that can be incorporated into the probe module 110 of the current sensing probe 105 in accordance with the disclosure. The current-to-voltage conversion circuit 400 can be used to measure various parameters such as an amplitude and a frequency of a sensed AC current ($I_{MEAS}$) that is sensed by the inductive current sensing element 210 and provided to the current-to-voltage conversion circuit 400 for conversion into a measured voltage ($V_{MEAS}$). Towards this end, the input AC current ($I_{MEAS}$) is propagated into a negative input terminal of an operational amplifier 425 via a current buffer circuit 450 disposed between the inductive current sensing element and a negative input terminal of the operational amplifier 425.

In this example implementation, the current buffer circuit 450 includes a transistor circuit arranged in a common-base configuration. In the common-base configuration, an emitter lead of a bi-polar transistor 430 is AC-coupled to the inductive current sensing element 210 (via an input coupling capacitor 405) and is also coupled through a biasing resistor 410 to a negative biasing voltage (Vee). A base lead of the bi-polar transistor 430 is coupled to ground via a resistor 415 and a collector lead of the bi-polar transistor 430 is coupled to a negative input terminal of the operational amplifier 425.

The common-base configuration provides a current ratio (α) that is defined by an equation α=Ic/Ie, where Ic refers to a collector current and Ie refers to an emitter current flowing through the bi-polar transistor 430. The emitter current Ie is always greater than the collector current Ic, thereby rendering α always less than 1. The common-base configuration however presents a series impedance between the inductive current sensing element 210 and the operational amplifier 425 that is significantly lower than a series impedance provided by a passive element (a resistor, for example) located between the inductive current sensing element 210 and the operational amplifier 425.

The current buffer circuit 450 also operates to provide isolation between the inductive current sensing element 210 and the negative input terminal of the operational amplifier 425 when the inductive current sensing element 210 is used for measuring an AC current flow in DUT 130.

In one example implementation, a value of the biasing resistor 410 is selected to provide a bias that places the bi-polar transistor 430 in a linear mode of operation. The linear mode of operation allows the bi-polar transistor 430 to present a reduced series impedance into the operational amplifier 425 when the inductive current sensing element 210 is used for measuring an AC current flow in DUT 130. The feedback resistor 435 can be selected for obtaining a desired gain-bandwidth product in the current-to-voltage conversion circuit 400. A compensation resistor 420 can be coupled into a positive input terminal of the operational amplifier 425 in order to compensate for any offset current or offset voltage that may be present in the operational amplifier 425.

It should be understood that in other embodiments, the current buffer circuit 450 can be implemented using transistors other than a npn bi-polar transistor, such as a pnp transistor or a field-effect transistor (FET).

Figure 5:
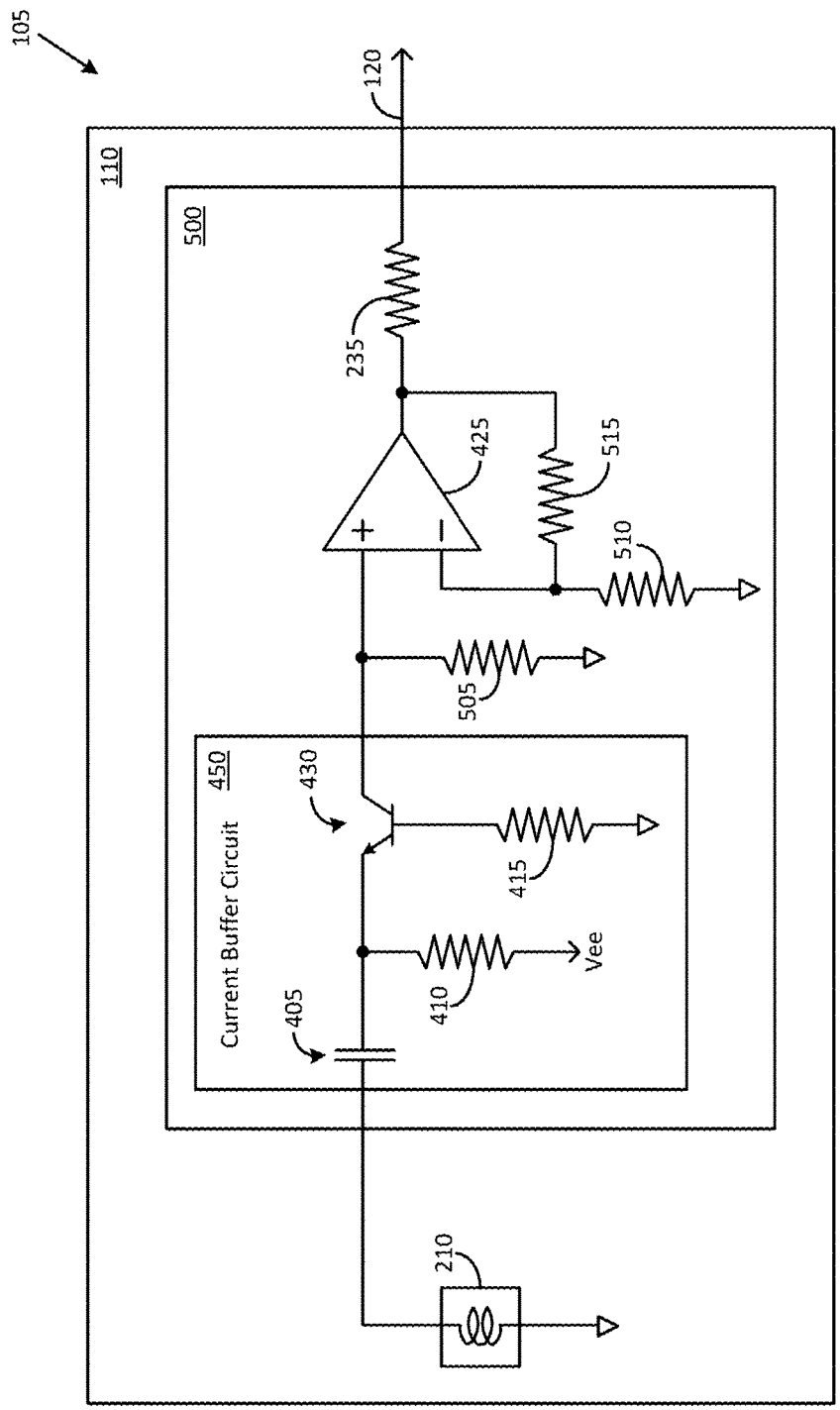
FIG. 5 illustrates a fourth exemplary circuit that can be incorporated into the current sensing probe shown in FIG. 1.

Attention is next drawn to FIG. 5, which illustrates a fourth exemplary current-to-voltage conversion circuit 500 that can be incorporated into the probe module 110 of the current sensing probe 105 in accordance with the disclosure. The current-to-voltage conversion circuit 500 includes the current buffer circuit 450 described above with reference to FIG. 4. However, in this exemplary implementation, the current buffer circuit 450 is disposed between the inductive current sensing element and a positive input terminal of the operational amplifier 425. The operational amplifier 425 operates as a non-inverting feedback amplifier with a gain greater than one. In one exemplary implementation, the positive feedback resistor 515 is selected to be about 10 ohms and the resistor 510 to be about 50 ohms. A resistor 505 is coupled to the positive input terminal of the operational amplifier 425 for purposes of biasing the bi-polar transistor 430 and can also be used for impedance matching purposes as well. Thus, in one example implementation, the resistor 505 can be a 50 ohm resistor that is selected on the basis of a 50 ohm characteristic impedance of the probe module 110. It will be pertinent to point out that the resistor 505 not only cooperates with the current buffer circuit 450 and the inductive current sensing element 210 to provide a matching impedance to the probe module 110, but is also operative to couple the positive input terminal of the operational amplifier 425 to ground.

In summary, it should be noted that the invention has been described with reference to a few illustrative embodiments for the purpose of demonstrating the principles and concepts of the invention. It will be understood by persons of skill in the art, in view of the description provided herein, that the invention is not limited to these illustrative embodiments. Persons of skill in the art will understand that many such variations can be made to the illustrative embodiments without deviating from the scope of the invention.

What is claimed is:

1. A current sensing probe comprising:
an inductive current sensing element; and
a current-to-voltage conversion circuit connected to the inductive current sensing element, the current-to-voltage conversion circuit comprising:
an operational amplifier;
a coupling capacitor disposed between the inductive current sensing element and a negative input terminal of the operational amplifier;
a first resistor coupled between the negative input terminal of the operational amplifier and an output node of the operational amplifier, the first resistor providing stability to the operational amplifier when the coupling capacitor blocks a first signal frequency that is below a threshold frequency; and
a second resistor coupled between a junction node, located between the inductive current sensing element and the coupling capacitor, and the output node of the operational amplifier, the second resistor operating in parallel with the first resistor to provide a transimpedance gain to a second signal frequency that is above the threshold frequency.

2. The current sensing probe of claim 1, wherein a resistance value of the second resistor provides a predetermined gain-bandwidth product in the current-to-voltage conversion circuit.

3. The current sensing probe of claim 1, wherein the inductive current sensing element comprises a coil of wire housed in one of a clip-on current probe or a solid core current probe.

4. The current sensing probe of claim 1, wherein each of the first signal frequency and the second signal frequency is associated with an AC current coupled into the inductive current sensing element from a device-under-test.

5. The current sensing probe of claim 1, wherein the threshold frequency corresponds to a minimum frequency of operation of the inductive current sensing element.

6. The current sensing probe of claim 5, wherein the coupling capacitor is selected in accordance with the minimum frequency of operation of the inductive current sensing element.

7. The current sensing probe of claim 6, wherein the coupling capacitor is further selected in accordance with an operational bandwidth of the inductive current sensing element.

8. The current sensing probe of claim 1, further comprising a cable assembly for connecting the current sensing probe to a measurement instrument.

9. The current sensing probe of claim 8, wherein the measurement instrument is at least one of an oscilloscope and a voltmeter.

10. A current sensing probe comprising:
an inductive current sensing element; and
a current-to-voltage conversion circuit connected to the inductive current sensing element, the current-to-voltage conversion circuit comprising:
an operational amplifier;
a coupling capacitor disposed between the inductive current sensing element and a negative input terminal of the operational amplifier;
a first resistor coupled between the negative input terminal of the operational amplifier and an output node of the operational amplifier, the first resistor providing stability to the operational amplifier when no current is coupled into the inductive current sensing element; and
a second resistor connected at one end between the inductive current sensing element and coupling capacitor, and coupled to the output node of the operational amplifier, the second resistor operating in parallel with the first resistor when impedance presented by the coupling capacitor is low in response to an AC current having a signal frequency above a threshold frequency being coupled into the inductive current sensing element.

11. The current sensing probe of claim 10, further comprising:
a compensation resistor that couples a positive input terminal of the operational amplifier to ground.

12. A current sensing probe comprising:
an inductive current sensing element; and
a current-to-voltage conversion circuit connected to the inductive current sensing element, the current-to-voltage conversion circuit comprising:
an operational amplifier; and
a current buffer circuit disposed between the inductive current sensing element and an input terminal of the operational amplifier, the current buffer circuit configured to couple into the operational amplifier an AC current sensed by the inductive current sensing element, the current buffer circuit comprising:
a transistor arranged in a common-base configuration, wherein an emitter of the transistor is AC-coupled to the inductive current sensing element and a collector of the transistor is connected to the input terminal of the operational amplifier;
a biasing resistor, connected between the emitter of the transistor and a negative biasing voltage, configured to provide a bias that places the transistor in a linear mode of operation; and
a resistor connected between the base of the transistor and ground.

13. The current sensing probe of claim 12, wherein the inductive current sensing element is adapted for coupling the current sensing probe to a current carrying element in a device-under-test.

14. The current sensing probe of claim 12, further comprising a coupling capacitor disposed between the inductive current sensing element and a junction node connected to the biasing resistor, wherein the current buffer circuit is further configured to maintain the input terminal of the operational amplifier at a voltage potential that provides stability to the operational amplifier when the coupling capacitor blocks a first signal frequency associated with an AC current coupled into the inductive current sensing element.

15. The current sensing probe of claim 12, wherein the input terminal of the operational amplifier is a positive input terminal of the operational amplifier.

16. The current sensing probe of claim 12, wherein the input terminal of the operational amplifier is a negative input terminal of the operational amplifier.

17. The current sensing probe of claim 12, wherein the current-to-voltage conversion circuit further includes a coupling capacitor disposed between the inductive current sensing element and the emitter lead of the transistor.

* * * * *